United States Patent
Leyh et al.

(10) Patent No.: US 10,826,678 B1
(45) Date of Patent: Nov. 3, 2020

(54) METHOD FOR RECOVERING A CLOCK SIGNAL AND CLOCK RECOVERY MODULE

(71) Applicant: Rohde & Schwarz GmbH & Co. KG, Munich (DE)

(72) Inventors: Julian Leyh, Munich (DE); Adrian Ispas, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/675,873

(22) Filed: Nov. 6, 2019

(51) Int. Cl.
  *H03K 5/159* (2006.01)
  *H04L 7/033* (2006.01)
  *H03L 7/08* (2006.01)
  *H04L 7/00* (2006.01)

(52) U.S. Cl.
  CPC .......... *H04L 7/0331* (2013.01); *H03L 7/0807* (2013.01); *H04L 7/0087* (2013.01)

(58) Field of Classification Search
  CPC .... H04L 7/0331; H04L 7/0087; H03L 7/0807
  USPC ................................................. 375/374–376
  See application file for complete search history.

(56) References Cited

U.S. PATENT DOCUMENTS

| | | | |
|---|---|---|---|
| 4,758,801 A | 7/1988 | Draxelmayr | |
| 9,806,880 B1 | 10/2017 | Wikiund et al. | |
| 2007/0253475 A1* | 11/2007 | Palmer | H04L 25/03006 375/229 |
| 2010/0135378 A1* | 6/2010 | Lin | H04L 25/03254 375/233 |
| 2011/0305271 A1* | 12/2011 | Zerbe | H04L 25/03885 375/232 |
| 2017/0228215 A1* | 8/2017 | Chatwin | G06F 7/5045 |
| 2017/0317859 A1* | 11/2017 | Hormati | H04L 7/033 |

* cited by examiner

*Primary Examiner* — Don N Vo
(74) *Attorney, Agent, or Firm* — Christensen O'Connor Johnson Kindness PLLC

(57) ABSTRACT

A method for recovering a clock signal from an input signal is disclosed. The method comprises the following steps: An input signal that comprises a symbol sequence having symbol edges is received. Edge timings of the symbol edges are determined, thereby generating an edge signal, the edge signal comprising information on the edge timings. The edge signal is processed via a filter module comprising a time variant filter, thereby generating the clock signal, the clock signal comprising information on at least one clock timing parameter. Further, a clock recovery module and a computer program are disclosed.

15 Claims, 3 Drawing Sheets

US 10,826,678 B1

METHOD FOR RECOVERING A CLOCK SIGNAL AND CLOCK RECOVERY MODULE

FIELD OF THE DISCLOSURE

Embodiments of the present disclosure relate generally to a method for recovering a clock signal. Embodiments of the present disclosure further relate to a clock recovery module for recovering a clock signal and to a computer program for recovering a clock signal.

BACKGROUND

Several serial transmission protocols, for example transmission protocols for high data rates, do not have a dedicated clock signal so that a clock data recovery (CDR) based on the data signal is required.

In the state of the art, clock data recovery is done by means of a phase-locked loop (PLL) based clock data recovery. Typically, analog components are used in order to avoid major delays in the feedbacks done by the PLL based clock recovery which might have an impact on the function and stability of the respective system used for clock data recovery.

Usual phase-locked loop techniques employ linear time invariant infinite impulse response (IIR) filters of 2nd order which can be implemented digitally but are not sufficient when high data rates, i.e. a high frequency and/or a large bandwidth are required, as they exhibit a latency being too large at least for real time applications.

Accordingly, there is a need for a clock recovery method as well as a clock recovery module that provide a fast clock recovery even for high frequencies and/or bandwidths.

SUMMARY

Embodiments of the present disclosure provide a method for recovering a clock signal from an input signal. In an embodiment, the method comprises the following steps: An input signal that comprises a symbol sequence having symbol edges is received. Edge timings of the symbol edges are determined, thereby generating an edge signal, the edge signal comprising information on the edge timings. The edge signal is processed via a filter module comprising a time variant filter, thereby generating the clock signal, the clock signal comprising information on at least one clock timing parameter.

Therein and in the following, the term "timings of the symbol edges are determined" is understood to also comprise the meaning that the timings of the symbol edges are estimated.

The method according to the disclosure is based on the finding that by employing a time variant filter the disadvantages of the usual phase-locked loop techniques, e.g., a high latency and/or a low bandwidth, are resolved.

By using the time variant filter in the filter module, small latencies or even no latency at all can be obtained. This is due to the fact that feedback loops of the time variant filter can, in principle, be chosen to be arbitrarily long or rather be arbitrarily delayed. Thus, the method for recovering the clock signal from the input signal according to the present disclosure is suitable for real time applications, where only very small latencies are allowed.

In an embodiment, the implemented filter length may be chosen to be longer than an apparent feedback loop delay.

Moreover, the method according to the disclosure provides a higher possible data rate compared to the phase-locked loops provided in the state of the art.

The clock timing parameter may be the clock timings of the clock underlying the input signal.

According to an aspect of the present disclosure, a side information signal is determined based on at least one of the input signal and the determined edge timings of the symbol edges, the side information signal comprising information on a location of the symbol edges with respect to individual symbols of the symbol sequence. The side information signal serves as additional information on the signal edges. For example, the side information signal serves as a further clarification whether there is a signal edge at a symbol time or not. Moreover, coefficients of the time variant filter may be determined based on the side information signal.

According to a further aspect of the present disclosure, the time variant filter is a time variant infinite impulse response (IIR) filter. It has been found that a feedback loop of the time variant IIR filter can be chosen to be arbitrarily long or rather can be arbitrarily delayed. Thus, a low latency and/or a high data rate are/is obtained.

In a further embodiment of the present disclosure, coefficients of the time variant infinite impulse response filter are determined by decomposing the time variant infinite impulse response filter into several time variant finite impulse response filters and at least one m-tap infinite impulse response filter. More precisely, the IIR filter is decomposed such that the m-tap IIR filter only depends on the M'th polyphase of the IIR filter's input signal. In order to allow for this behavior, the FIR has to be adapted to employ inputs from all polyphases. By choosing M to be big enough, the feedback part of the IIR filter is delayed by enough time such that all latency issues are resolved.

In an embodiment, M may be chosen to be a multiple of the data's parallelity in a field programmable gate array (FPGA).

Coefficients defining the finite impulse response filters are calculable recursively. Moreover, coefficients defining the m-tap infinite impulse response filter are calculable based on the coefficients of the finite impulse response filters.

Therein, m is an integer bigger than 1. In an embodiment, m is equal to 2, such that the m-tap-IIR filter is established as a 2-tap IIR filter.

According to another aspect of the present disclosure, the time variant infinite impulse response filter is decomposed in time domain. As the filter is time variant, the coefficients describing the filter vary over time, for example in a non-repetitive way. Accordingly, a frequency domain representation of the filter is not suitable for real time applications. In time domain, however, the time variant filter, for example the IIR filter, can be decomposed in real time.

The coefficients may be determined based on the side information signal. More precisely, coefficients of the time variant filter may be determined by a comparison of a standard representation of the time variant filter and the decomposed variant described above.

In another embodiment of the present disclosure, at least one of the coefficients is determined recursively. In an embodiment, coefficients of at least one of the FIR filters may be determined recursively.

The time variant infinite impulse response filter may be decomposed into the at least one m-tap infinite impulse response filter, a three-tap time variant finite impulse response filter, a M-tap time variant finite impulse response filter and a (M−1)-tap time variant finite impulse response filter. As already explained above, by choosing M to be big enough, the feedback part of the IIR filter is delayed by enough time such that all latency issues are resolved.

In an embodiment, coefficients of the M-tap FIR filter and/or of the (M−1)-tap FIR filter may be determined recursively.

According to another aspect of the present disclosure, the filter module does not comprise any further filters. In other words, the filter module may consist of the m-tap infinite impulse response filter, the three-tap time variant finite impulse response filter, the M-tap time variant finite impulse response filter and the (M−1)-tap time variant finite impulse response filter. Thus, no further filters are needed with this particular filter module structure.

The input signal may be PAM-N coded, wherein N is an integer bigger than 1. Accordingly, the method is not limited to binary signals (PAM-2 coded) since any kind of pulse-amplitude modulated signals may be processed.

Embodiments of the present disclosure further provide a clock recovery module for recovering a clock signal from an input signal. The clock recovery module comprises an edge recovery module and a filter module. The filter module comprises at least one time variant filter. The edge recovery module is configured to determine edge timings of symbol edges, wherein the symbol edges are assigned to a symbol sequence of the input signal. The time variant filter is configured to recover the clock signal based on the edge timings. Regarding the advantages of the clock recovery module, reference is made to the explanations given above with respect to the method for recovering a clock signal, which also hold for the clock recovery module and vice versa.

In an embodiment, the clock recovery module is configured to perform the method for recovering a clock signal from an input signal described above.

In an embodiment of the present disclosure, the edge recovery module is configured to determine a side information signal based on at least one of the input signal and the determined timings of the symbol edges, the side information signal comprising information on a location of symbol edges with respect to individual symbols of the symbol sequence. The side information signal serves as additional information on the signal edges. For example, the side information signal serves as a further clarification whether there is a signal edge at a symbol time or not. Moreover, coefficients of the time variant filter may be determined based on the side information signal.

According to an aspect of the present disclosure, the time variant filter is a time variant infinite impulse response filter. It has been found that a feedback loop of the time variant IIR filter can be chosen to be arbitrarily long or rather can be arbitrarily delayed. Thus, a low latency and/or a high data rate is obtained.

According to another aspect of the present disclosure, the filter module is configured to determine coefficients of the time variant infinite impulse response filter by decomposing the time variant infinite impulse response filter into several time variant finite impulse response filters and at least one m-tap infinite impulse response filter. More precisely, the IIR filter is decomposed such that the m-tap IIR filter only depends on the M'th polyphase of the IIR filter's input signal. In order to allow for this behavior, the FIR has to be adapted to employ inputs from all polyphases. By choosing M to be big enough, the feedback part of the IIR filter is delayed by enough time such that all latency issues are resolved.

The filter module may be configured to determine the coefficients based on the side information signal. More precisely, the filter module may be configured to determine the coefficients of the time variant filters by a comparison of a standard representation of the time variant filter and the decomposed variant described above.

In a further embodiment of the present disclosure, the filter module is configured to determine the at least one of the coefficients recursively. In an embodiment, the filter module may be configured to determine the coefficients of at least one of the FIR filters recursively.

According to another aspect of the present disclosure, the filter module is configured to decompose the time variant infinite impulse response filter into the at least one m-tap infinite impulse response filter, a three-tap time variant finite impulse response filter, a M-tap time variant finite impulse response filter and a (M−1)-tap time variant finite impulse response filter. As already explained above, by choosing M to be big enough, the feedback part of the IIR filter is delayed by enough time such that all latency issues are resolved.

According to another embodiment of the present disclosure, the filter module does not comprise any further filters. In other words, the filter module may consist of the m-tap infinite impulse response filter, the three-tap time variant finite impulse response filter, the M-tap time variant finite impulse response filter and the (M−1)-tap time variant finite impulse response filter. Thus, no further filters are needed with this particular filter module structure.

The input signal may be PAM-N coded, wherein N is an integer bigger than 1. Accordingly, the clock recovery module is not limited to binary signals (PAM-2 coded) since any kind of pulse-amplitude modulated signals may be processed.

Embodiments of the present disclosure further provide a computer program for recovering a clock signal from an input signal by using a clock recovery module comprising an edge recovery module and a filter module. The input signal comprises a symbol sequence having symbol edges. The computer program comprises program code being adapted to cause the clock recovery module to perform the following steps when the computer program is executed on the clock recovery module:

determining edge timings of the symbol edges, thereby generating an edge signal, the edge signal comprising information on the edge timings;

processing the edge signal via a filter module comprising a time variant filter, thereby generating the clock signal, the clock signal comprising information on at least one clock timing parameter.

Regarding the advantages of the computer program, reference is made to the explanations given above with respect to the method for recovering a clock signal, which also hold for the computer program and vice versa.

More specifically, the clock recovery module described above may comprise a computer program having program code being adapted to cause the clock recovery module to perform the steps of the method for recovering a clock signal from an input signal described above when the computer program is executed on the clock recovery module.

As used herein, the term "program code" or "program code means" is understood to comprise machine-readable instructions in compiled and/or uncompiled form being provided in any suitable programming language and/or machine language.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
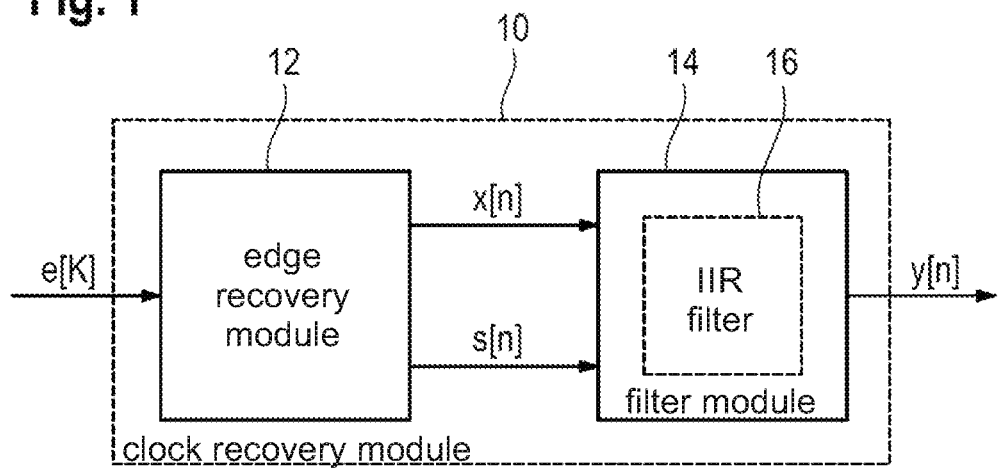
FIG. 1 schematically shows an example of a clock recovery module according to the disclosure.

FIG. 1 schematically shows a clock recovery module 10 that comprises an edge recovery module 12 and a filter module 14. Generally speaking, the clock recovery module 10 is established as hardware and/or as software. The hardware and/or software can be embedded in a measurement instrument that is configured to analyze signals that are obtained via communication protocols with high frequency and/or bandwidth. In an embodiment, the hardware and/or software may be part of an oscilloscope.

The filter module 14 comprises a time variant infinite impulse response filter 16. Generally speaking, the clock recovery module 10 is configured to recover a clock signal $y[n]$ from an input signal that comprises a symbol sequence having symbol edges at times $e[k]$, wherein $k$ numerates the signal edges.

The input signal may be PAM-N coded, wherein N is an integer bigger than 1. Therein, N determines the number of different values that the input signal can attain. For example, N may be equal to 2 such that the input signal is a binary signal.

Figure 2:
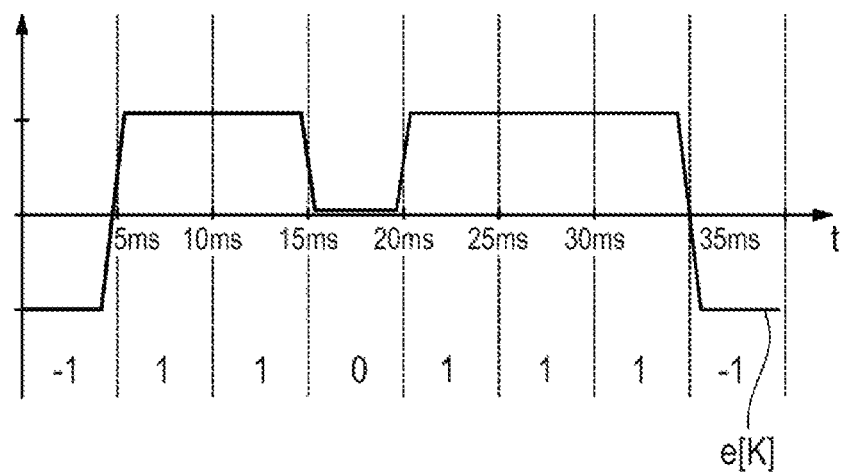
FIG. 2 schematically shows an input signal amplitude plotted against time.

An example of the input signal plotted against time for N=3 is shown in FIG. 2. Therein, the individual symbols and the respective value of the input signal are added for illustration purposes. In fact, this information has to be recovered from the input signal.

Figure 3:
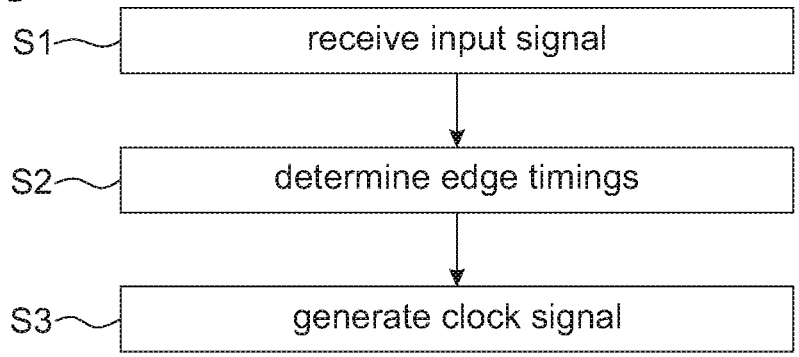
FIG. 3 schematically shows a block diagram of a representative method for recovering a clock signal according to the disclosure.

The clock recovery module 10 is configured to perform a method for recovering the clock signal $y[n]$ from the input signal that is explained in the following with reference to FIG. 3. More specifically, the clock recovery module 10 may comprise a computer program having program code being adapted to cause the clock recovery module 10 to perform the following steps when the computer program is executed on the clock recovery module 10.

First, the input signal is received by the edge recovery module 12 (step S1). The edge recovery module 12 determines the edge timings $e[k]$ of the symbol edges comprised in the input signal, thereby generating an edge signal $x[n]$ (step S2).

The edge recovery module 12 may determine the edge timings $e[k]$ by employing a feed-forward clock data recovery technique. An example for such a technique is explained in detail in the pending European patent application number 18 207 909.5, which is hereby incorporated by reference in its entirety.

The value of the edge signal $x[n]$ is equal to the time of the respective symbol edge if there is a symbol edge and is equal to 0 otherwise. In other words, the edge signal $x[k]$ comprises information on the edge timings $e[k]$ of the symbol edges.

In the example shown in FIG. 2, the edge signal $x[n]$ has the following form:

$$x[n] = \begin{pmatrix} 5 \text{ ms} \\ 0 \\ 10 \text{ ms} \\ 20 \text{ ms} \\ 0 \\ 0 \\ 35 \text{ ms} \end{pmatrix}.$$

Thus, the edge recovery module 12 assigns the signal edge timings $e[k]$ comprised in the input signal to the respective symbols comprised in the input signal, i.e. $x[n]=e[k]$ if the edge number $k$ corresponds to the bit number $n$ and $x[n]=0$ otherwise.

Moreover, the edge recovery module 12 determines a side information signal $s[n]$ with $s[n]=1$ if the edge number $k$ corresponds to the bit number $n$ and $s[n]=0$ otherwise. The side information signal $s[n]$ serves as additional information on the signal edges.

For example, if there is a signal edge at 0 ms, the side information signal value $s[n]=1$ clarifies that $x[n]=0$ means "0 ms" rather than "no signal edge". On the other hand, if there is no signal edge at 0 ms, the side information signal value $s[n]=0$ clarifies that $x[n]=0$ means "no signal edge" rather than "0 ms".

In the example of FIGURE, $s[n]$ has the following form:

$$s[n] = \begin{pmatrix} 1 \\ 0 \\ 1 \\ 1 \\ 0 \\ 0 \\ 1 \end{pmatrix}.$$

The clock timing parameter may be the clock timings of the clock underlying the input signal.

The edge signal $x[n]$ and the side information signal $s[n]$ are forwarded to the filter module 14 and processed by the filter module 14, thereby generating a clock signal $y[n]$ that comprises information on at least one clock timing parameter (step S3). Step S3 will be explained in more detail below.

From the state-of-the-art, clock recovery methods employing a phase locked loop (PLL) are known that employ a linear time invariant infinite impose response (IIR) filter of $1^{st}$ or $2^{nd}$ order in order to recover the clock signal $y[n]$.

The clock signal y[n] provided by such phase locked loops has the following general form: y[n]=$a_1$y[n−1]+$a_2$y[n−2]+$b_0$d[n]+$b_1$d[n−1]+$b_2$d[n−2].

Therein, $a_1$ and $a_2$ are coefficients of the so-called feedback terms, while $b_0$, $b_1$ and $b_2$ are coefficients of the so-called feedforward terms.

Usually, the phase locked loop comprises a multiplexer that chooses a value for d[n], d[n−1] and d[n−2] in every iteration.

The output d[n] of the multiplexer can be equal to y[n] or to x[n], d[n−1] can be equal to y[n−1] or to x[n−1] and d[n−2] can be equal to y[n−2] or to x[n−2]. Hence, there are 8 different possibilities for y[n], which are determined to be the following:

$$y[n]=a_1y[n-1]+a_2y[n-2]+b_0x[n]+b_1x[n-1]+b_2x[n-2]$$

$$y[n]=1/1-b_0(a_1y[n-1]+a_2y[n-2]+b_1x[n-1]+b_2x[n-2])$$

$$y[n]=(a_1+b_1)y[n-1]+a_2y[n-2]+b_0x[n]+b_2x[n-2]$$

$$y[n]=1/1-b_0((a_1+b_1)y[n-1]+a_2y[n-2]+b_2x[n-2])$$

$$y[n]=a_1y[n-1]+(a_2+b_2)y[n-2]+b_0x[n]+b_1x[n-1]$$

$$y[n]=1/1-b_0(a_1y[n-1]+(a_2+b_2)y[n-2]+b_1x[n-1])$$

$$y[n]=(a_1+b_1)y[n-1]+(a_2+b_2)y[n-2]+b_0x[n]$$

$$y[n]=1/1-b_0((a_1+b_1)y[n-1]+(a_2+b_2)y[n-2]) \quad (E.1)$$

The associated values for the side information signal for the individual lines in equation (E.1) are the following:

| Line # | s[n] | s[n − 1] | [n − 2] |
|---|---|---|---|
| 1 | 1 | 1 | 1 |
| 2 | 0 | 1 | 1 |
| 3 | 1 | 0 | 1 |
| 4 | 0 | 0 | 1 |
| 5 | 1 | 1 | 0 |
| 6 | 0 | 1 | 0 |
| 7 | 1 | 0 | 0 |
| 8 | 0 | 0 | 0 |

The method for recovering the clock signal y[n] according to the disclosure removes the need for the multiplexer by employing the time variant infinite impulse response filter 16, which is indicated by the dashed square in FIG. 1. The clock signal y[n] then has the following general form:

$$y[n]=a_1^{(n)}y[n-1]+a_2^{(n)}y[n-2]+b_0^{(n)}x[n]+b_1^{(n)}x[n-1]+b_2^{(n)}x[n-2]. \quad (E.2)$$

The coefficients $a_i^{(n)}$ of the feedback terms and the coefficients $b_i^{(n)}$ of the feedforward time are now time dependent, as is indicated by the superscript "(n)". In other words, the coefficients $a_i^{(n)}$ and $b_i^{(n)}$ can change with every input sample.

Figure 4:
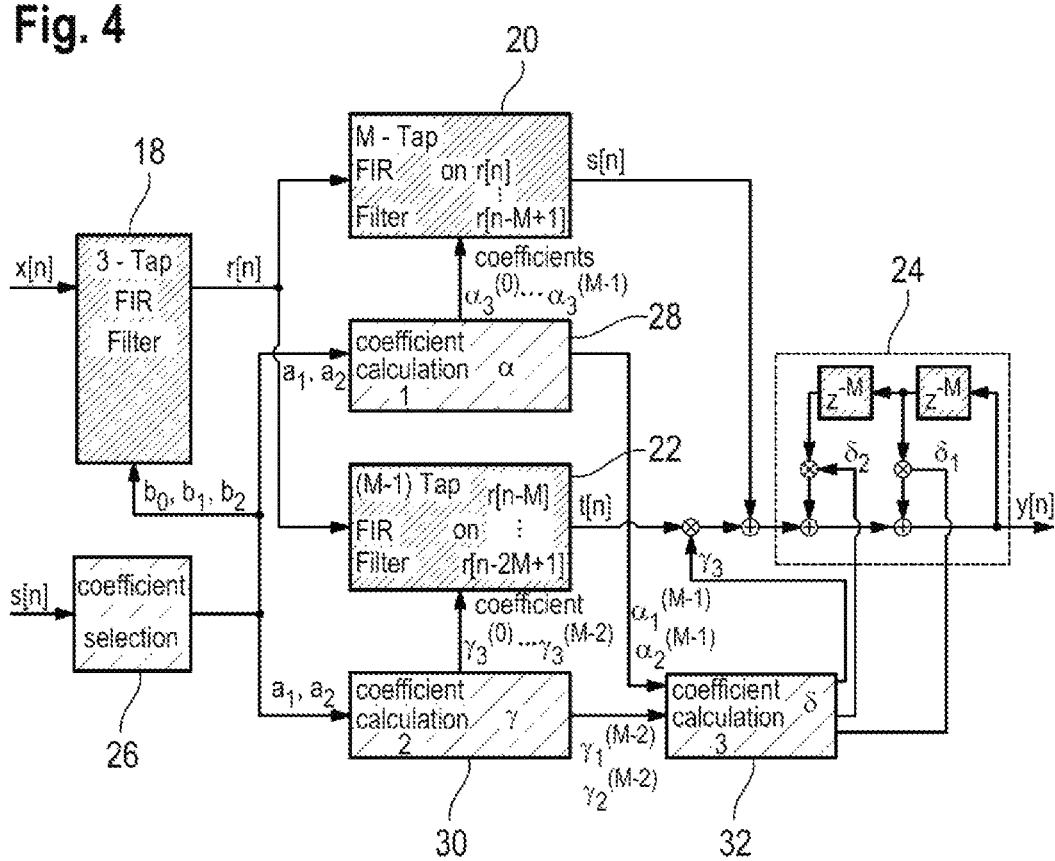
FIG. 4 schematically shows a block diagram of an example of a filter module of the clock recovery module of FIG. 1.

As is shown in FIG. 4, the time variant infinite impulse response filter 16 is decomposed into a three-tap finite impulse response (FIR) filter 18, a M-tap finite impulse response filter 20, a (M−1)-tap finite impulse response filter 22 and a m-tap infinite impulse response filter 24 in order to calculate the coefficients $a_i^{(n)}$ and $b_i^{(n)}$. Therein, m and M each are integers bigger than 1. In an embodiment, m is equal to 2, such that the IIR filter 24 is established as a 2-tap IIR filter.

In some embodiments, the FIR filters 18, 20 and 22 as well as the IIR filter 24 may be the only filters comprises in the filter module 14. In other words, no further filters may be provided.

Moreover, a coefficient selection block 26, a first coefficient calculation block 28, a second coefficient calculation block 30 and a third coefficient calculation block 32 are provided.

The decomposition into the FIR filters 18, 20, 22 and the IIR filter 24 is done in time domain.

The intended result, namely a second order polyphase adaptive IIR filter, has the following form:

$$y[n] = \omega_1^{(n)}y[n-M] + \omega_2^{(n)}y[n-2M] + \sum_{l=0}^{2M-1} \omega_{3+l}^{(n)}x[n]. \quad (E.3)$$

Therein, $\omega_i^{(n)}$ is a new set of time dependent coefficients. The IIR filter of equation (E.3) is constructed such that the autoregressive part (i.e. $\omega_1^{(n)}y[n-M]+\omega_2^{(n)}y[n-2M]$) only employs the M'th polyphase of the signal. In order to allow for this behavior, the FIR part $$\left(\sum_{l=0}^{2M-1} \omega_{3+l}^{(n)} x[n]\right)$$

has to be adapted to employ inputs from all polyphases, as is evident from the sum $$\sum_{l=0}^{2M-1}.$$

In order to achieve the form of equation (E.3), equation (E.2) is rewritten in the following form:

$$y[n]=a_1^{(n)}y[n-1]+a_2^{(n)}y[n-2]+r[n] \quad (E.4)$$

$$r[n]=b_0^{(n)}x[n]+b_1^{(n)}x[n-1]+b_2^{(n)}x[n-2] \quad (E.5)$$

The term r[n] as defined in equation (E.5), which may also be called "moving average part", defines the three-tap FIR filter 18.

As is illustrated in FIG. 4, the side information signal s[n] is forwarded to the coefficient selection block 26, which selects the coefficients $b_0^{(n)}$, $b_1^{(n)}$ and $b_2^{(n)}$ based on the side information signal s[n]. The selected coefficients $b_0^{(n)}$, $b_1^{(n)}$ and $b_2^{(n)}$ are then forwarded to the three-tap FIR filter 18.

The three-tap FIR filter 18 processes the edge signal x[n] and determines the feedforward terms described by r[n] based on equation (E.5), e.g., based on the edge signal x[n] and the coefficients $b_0^{(n)}$, $b_1^{(n)}$ and $b_2^{(n)}$ received from the coefficient selection block 26.

The feedforward terms r[n] are then forwarded to both the M-tap FIR filter 20 and to the (M−1)-tap FIR filter 22.

Moreover, the coefficient selection block 26 selects the coefficients $a_1^{(n)}$ and $a_2^{(n)}$ based on the side information signal s[n] and forwards the coefficients $a_1^{(n)}$ and $a_2^{(n)}$ to the first coefficient calculation block 28 and to the second coefficient calculation block 30.

More precisely, the coefficient selection block 26 determines the coefficients $a_1^{(n)}$, $a_2^{(n)}$, $b_0^{(n)}$, $b_1^{(n)}$ and $b_2^{(n)}$ by comparing the coefficients in equations (E.1) and (E.2) and selecting the appropriate form for y[n] based on whether a signal edge is associated with any of the past received symbols, for example with the past three received symbols as indicated by s[n], s[n−1] and s[n−2].

For example, if all three latest received symbols have a symbol edge associated with them, a comparison of coefficients is performed between equation (E.2) and the first line of equation (E.1). In this case, $a_1^{(n)}=a_1$, $a_2^{(n)}=a_2$, $b_0^{(n)}=b_0$ etc. is obtained.

If the three latest received symbols do not have a symbol edge associated with them, a comparison of coefficients is performed between equation (E.2) and the last line of equation (E.1). In this case, $a_1^{(n)}=(a_1+b_1)/(1-b_0)$, $a_2^{(n)}=(a_2+b_2)/(1-b_0)$ and $b_0^{(n)}=b_1^{(n)}=b_2^{(n)}=0$ is obtained.

As an intermediate step to achieve the form of equation (E.3), equation (E.4) is rewritten in the following form:

$$y[n] = \alpha_1^{(M)} y[n-M] + \alpha_2^{(M)} y[n-M-1] + \sum_{l=0}^{M-1} \alpha_3^{(l+1)} r[n-l]. \quad (E.6)$$

The first coefficient calculation block 28 determines the coefficients $\alpha_i^{(k)}$ recursively by substituting the right-hand side of equation (E.4) with the whole equation (E.4). This way, the coefficients $\alpha_i^{(k)}$ are recursively determined to be:

$$\alpha_1^{(k)} = \alpha_1^{(k-1)} a_1^{(k)} + \alpha_2^{(k-1)}$$

$$\alpha_2^{(k)} = \alpha_1^{(k-1)} a_2^{(k)}$$

$$\alpha_3^{(k)} = \alpha_1^{(k-1)} \quad (E.7)$$

The initial values for the recursion in equation (E.7) are $\alpha_1^{(0)}=1$, $\alpha_2^{(0)}=0$ and $\alpha_3^{(0)}=0$. The determined coefficients $\alpha_i^{(k)}$ are forwarded to both the M-tap FIR filter 20 and to the third coefficient calculation block 32.

With the determined coefficients $\alpha_i^{(k)}$, equation (E.6) can be rewritten as $$y[n] = \alpha_1^{(M)} y[n-M] + \alpha_2^{(M)} y[n-M-1] + q[n] \quad (E.8)$$

$$q[n] = \sum_{l=0}^{M-1} \alpha_3^{(l+1)} r[n-l].$$

In order to arrive at the form of equation (E.3), y[n−M−1] in equation (E.8) has to be rewritten in terms of y[n−2M]. For this purpose, the following identity is used:

$$y[n-2M] = \quad (E.9)$$

$$\gamma_1^{(M)} y[n-M] + \gamma_2^{(M)} y[n-M-1] + \sum_{l=1}^{M-1} \gamma_3^{(l)} r[n-2M+l+1].$$

Therein, $\gamma_i^{(k)}$ are new time variant coefficients.

The identity of equation (E.9) is obtained by solving equation (E.4) for y[n−2] and by setting n→n−2M+2. This procedure yields $$y[n-2M] = \frac{1}{a_2^{(n-2M+2)}}(y - a_1^{(n-2M+2)} y[n-2M+1] - r[n]). \quad (E.10)$$

From equation (E.10), the following recursive rules for computing the coefficients $\gamma_i^{(k)}$ are derived:

$$\gamma_1^{(k)} = \frac{\gamma_2^{(k-1)}}{a_2^{(k)}} \quad (E.11)$$

$$\gamma_2^{(k)} = \gamma_1^{(k-1)} - \frac{\gamma_2^{(k-1)}}{a_2^{(k)}}$$

$$\gamma_3^{(k)} = -\frac{\gamma_2^{(k-1)}}{a_2^{(k)}}.$$

The initial values for the recursion of equation (E.11) are $\gamma_1^{(0)}=0$, $\gamma_2^{(0)}=1$ and $\gamma_3^{(0)}=0$.

The second coefficient calculation block 30 employs the recursion relations of equation (E.11) in order to determine the coefficients $\gamma_i^{(k)}$.

The determined coefficients $\alpha_i^{(k)}$ and $\gamma_i^{(k)}$ are forwarded to the third coefficient calculation block 32.

With the determined coefficients $\gamma_i^{(k)}$, equation (E.10) can be rewritten as $$y[n-2M] = \gamma_1^{(M)} y[n-M] + \gamma_2^{(M)} y[n-M-1] + t[n] \quad (E.12)$$

$$t[n] = \sum_{l=1}^{M-1} \gamma_3^{(l)} r[n-2M+l+1].$$

Equations (E.12) in conjunction with equation (E.6) then gives $$y[n] = \delta_1 y[n-M] + \delta_2 y[n-2M] + \delta_3 t[n] + q[n], \quad (E.13)$$

with new time variant coefficients $\delta_i$.

The third coefficient calculation block determines the new time variant coefficients based on the coefficients $\alpha_i^{(k)}$ and $\gamma_i^{(k)}$ received from the first coefficient calculation block 28 and the second coefficient calculation block 30, respectively, according to the following relations:

$$\delta_1 = \alpha_1^{(M)} - \frac{\alpha_2^{(M)} \gamma_1^{(M)}}{\gamma_2^{(M)}} \quad (E.14)$$

$$\delta_2 = \frac{\alpha_2^{(M)}}{\gamma_2^{(M)}}$$

$$\delta_3 = -\frac{\alpha_2^{(M)}}{\gamma_2^{(M)}}$$

It is noted that the relations given in equation (E.14) are not recursive in themselves, but rather involve simple summation, multiplication and division operations based on the recursively determined coefficients $\alpha_i^{(M)}$ and $\gamma_i^{(M)}$.

Summarizing, the procedure for recovering the clock signal y[n] is as follows: First, the moving average term r[n] is determined, which in turn is used to determine the terms q[n] and t[n] along with the coefficients $\alpha_i^{(M)}$, $\gamma_i^{(M)}$ and $\delta_i$.

Finally, the clock signal y[n] is determined employing equation (E.13), which is the only feedback operation that needs to be done with latency in mind. This feedback operation is performed by the IIR filter 24.

Issues with the latency are resolved by choosing M to be large enough such that delays are introduced in the feedback operation.

As is apparent from equation (E.13), the feedback terms only depend on the clock signal y[n−M] that is delayed by (n−M) symbols and on the clock signal y[n−2M] that is delayed by (n−2M) symbols.

The determination of r[n] does not pose a problem with respect to latency, as the calculation of r[n] can be parallelized. For each parallel input sample of the edge signal x[n], only the input sample and the respective two earlier input samples x[n−1] and x[n−2] are needed.

Figure 5:
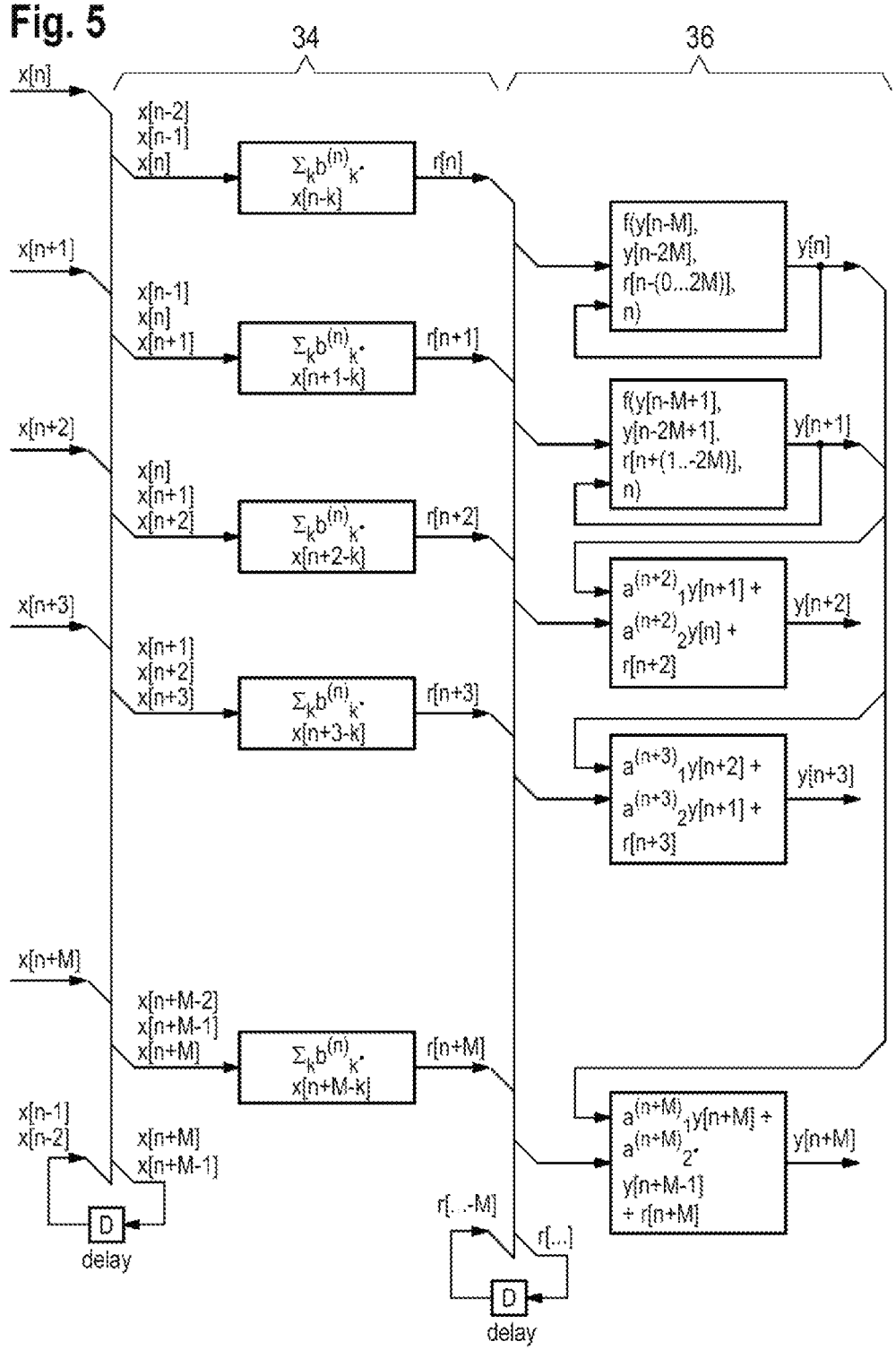
FIG. 5 schematically shows a parallelized structure of the filter module of FIG. 4.

A parallelized structure for the filter module 16 or rather for the decomposed time variant infinite impulse response filter as described above is depicted in FIG. 5. On the left-hand side, a parallelized FIR filter part 34, i.e. the moving average part for the calculation of r[n], r[n+1] etc. is shown. On the right-hand side, a parallelized IIR filter part 36, e.g., the so-called auto-regressive part is shown.

As described above, one or more aspects of the methods set forth herein are carried out in a computer system. In this regard, program code or a program element, or computer program product is provided, which is configured and arranged when executed on a computer to carry out the functionality described herein. In one embodiment, the program element, or computer program product or program code may be specifically configured to perform one or more of the steps of method claims 1-9 set forth below.

The program element or other program code or instructions described or illustrated herein (e.g., as one or more method or process steps) may be installed in a computer readable storage medium. The computer readable storage medium may be any one of the computers, etc., described elsewhere herein or another and separate computing device, etc., as may be desirable. The computer readable storage medium and the program element, which may comprise computer-readable program code portions embodied therein, may further be contained within a non-transitory computer program product.

As mentioned, various embodiments of the present disclosure may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory and/or the like.

In some embodiments, a volatile computer-readable storage medium may include random access memory (RAM), dynamic random access memory (DRAM), static random access memory (SRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above As should be appreciated, various embodiments of the present disclosure may also be implemented as methods, apparatus, systems, computing devices, computing entities, and/or the like, as have been described elsewhere herein. As such, embodiments of the present disclosure may take the form of an apparatus, system, computing device, computing entity, and/or the like executing instructions stored on a computer-readable storage medium to perform certain steps or operations. However, embodiments of the present disclosure may also take the form of an entirely hardware embodiment performing certain steps or operations.

Various embodiments are described above with reference to block diagrams and flowchart illustrations of apparatuses, methods, systems, and computer program products. It should also be understood that each block of the block diagrams, flowchart illustrations, and related descriptions, and combinations of blocks in the block diagrams, flowchart illustrations, and related descriptions, could be implemented by special purpose hardware-based computer systems that perform the specified functions or operations, or combinations of special purpose hardware and computer instructions.

It should be understood that any of the block diagrams, flowchart illustrations, and related descriptions, or parts thereof, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks and related description, and/or to perform one or more methodologies or technologies described herein.

The term computer can include any processing structure, including but is not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

In an embodiment, clock recovery module, the filter module, the time variant infinite impulse response filter, and/or other components of the system described herein may include hardware circuit implementations (e.g., implementations in analog circuitry, implementations in digital circuitry, and the like, and combinations thereof) for implementing the functionality described herein. In an embodiment, clock recovery module, the filter module, the time variant infinite impulse response filter, and/or other components of the system described herein includes combinations of circuits and computer program products having software or firmware instructions stored on one or more computer readable memories that work together to cause a device to perform one or more methodologies or technologies described herein.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for recovering a clock signal from an input signal, comprising:
   receiving an input signal that comprises a symbol sequence having symbol edges;
   determining edge timings of said symbol edges, thereby generating an edge signal, said edge signal comprising information on said edge timings;
   processing said edge signal via a filter module comprising a time variant filter, thereby generating said clock signal, said clock signal comprising information on at least one clock timing parameter,
   wherein said time variant filter is a time variant infinite impulse response filter, and wherein coefficients of said time variant infinite impulse response filter are determined by decomposing said time variant infinite impulse response filter into several time variant finite impulse response filters and at least one m-tap infinite impulse response filter.

2. The method of claim 1, wherein a side information signal is determined based on at least one of said input signal and said determined edge timings of said symbol edges, said side information signal comprising information on a location of said symbol edges with respect to individual symbols of said symbol sequence.

3. The method of claim 2, wherein said coefficients are determined based on said side information signal.

4. The method of claim 1, wherein at least one of said coefficients is determined recursively.

5. The method of claim 1, wherein said several time variant infinite impulse response filters include a three-tap time variant finite impulse response filter, a M-tap time variant finite impulse response filter and a (M−1)-tap time variant finite impulse response filter.

6. The method of claim 1, wherein said filter module does not comprise any further filters.

7. The method of claim 1, wherein said input signal is PAM-N coded, wherein N is an integer bigger than 1.

8. A clock recovery apparatus for recovering a clock signal from an input signal, comprising:
   an edge recovery module and a filter module;
   said filter module comprising at least one time variant filter;
   said edge recovery module being configured to determine edge timings of symbol edges, said symbol edges being assigned to a symbol sequence of said input signal; and
   said time variant filter being configured to recover said clock signal based on said edge timing,
   wherein said time variant filter is a time variant infinite impulse response filter, and
   wherein said filter module is configured to determine coefficients of said time variant infinite impulse response filter by decomposing said time variant infinite impulse response filter into several time variant finite impulse response filters and at least one m-tap infinite impulse response filter.

9. The clock recovery apparatus of claim 8, wherein the edge recovery module is configured to determine a side information signal based on at least one of said input signal and said determined timings of said symbol edges, said side information signal comprising information on a location of symbol edges with respect to individual symbols of said symbol sequence.

10. The clock recovery apparatus of claim 9, wherein said filter module is configured to determine said coefficients based on said side information signal.

11. The clock recovery apparatus of claim 8, wherein said filter module is configured to determine the at least one of said coefficients recursively.

12. The clock recovery apparatus of claim 8, wherein said several time variant infinite impulse response filters include a three-tap time variant finite impulse response filter, a M-tap time variant finite impulse response filter and a (M−1)-tap time variant finite impulse response filter.

13. The clock recovery apparatus of claim 8, wherein said filter module does not comprise any further filters.

14. The clock recovery apparatus of claim 8, wherein said input signal is PAM-N coded, wherein N is an integer bigger than 1.

15. A non-transitory computer readable medium having executable instructions stored thereon for recovering a clock signal from an input signal, said input signal including a symbol sequence having symbol edges, wherein said executable instructions when executed by one or more computing devices cause the one or more computing devices to perform the actions of:
   determining edge timings of said symbol edges, thereby generating an edge signal, said edge signal comprising information on said edge timings;
   processing said edge signal via a time variant filter, thereby generating said clock signal, said clock signal comprising information on at least one clock timing parameter,
   wherein said time variant filter is a time variant infinite impulse response filter, and wherein coefficients of said time variant infinite impulse response filter are determined by decomposing said time variant infinite impulse response filter into several time variant finite impulse response filters and at least one m-tap infinite impulse response filter.

* * * * *